United States Patent [19]

Early et al.

[11] Patent Number: 5,208,597
[45] Date of Patent: May 4, 1993

[54] COMPENSATED CAPACITORS FOR SWITCHED CAPACITOR INPUT OF AN ANALOG-TO-DIGITAL CONVERTER

[75] Inventors: Adrian B. Early, Buda; Baker P. L. Scott, III, Austin, both of Tex.

[73] Assignee: Crystal Semiconductor, Austin, Tex.

[21] Appl. No.: 455,171

[22] Filed: Dec. 22, 1989

Related U.S. Application Data

[62] Division of Ser. No. 257,477, Oct. 13, 1988, Pat. No. 4,918,454.

[51] Int. Cl.$^5$ .............................................. H03M 1/00
[52] U.S. Cl. ..................................... 341/172; 361/303
[58] Field of Search ............... 341/118, 144, 150, 155, 341/172; 377/62, 63; 361/303, 306, 321, 328; 357/24

[56] References Cited

U.S. PATENT DOCUMENTS

| | | |
|---|---|---|
| 4,626,881 | 10/1986 | Kishi . |
| 4,639,087 | 1/1987 | Cannella ............................. 350/332 |
| 4,694,314 | 9/1987 | Terada et al. ...................... 357/23.6 |
| 4,700,457 | 10/1987 | Matsukawa .......................... 437/52 |
| 4,731,696 | 3/1988 | Himes et al. ........................ 361/313 |
| 4,758,873 | 7/1988 | Monticelli ........................... 357/51 |
| 4,878,151 | 10/1989 | Gallichio ............................ 361/329 |
| 4,918,454 | 4/1990 | Early et al. ......................... 341/172 |
| 5,016,070 | 5/1991 | Sundaresan ........................ 357/23.6 |
| 5,042,916 | 8/1991 | Ukai et al. ......................... 359/59 |

FOREIGN PATENT DOCUMENTS

| | | | |
|---|---|---|---|
| 0145606A2 | 12/1984 | European Pat. Off. ............... | 27/10 |
| 0150597A1 | 12/1984 | European Pat. Off. ............... | 21/82 |
| 0159824A2 | 3/1985 | European Pat. Off. ............... | 27/10 |
| 0169346A1 | 5/1985 | European Pat. Off. ............... | 27/10 |
| 0197713A2 | 3/1986 | European Pat. Off. ............... | 11/24 |
| 0263287A2 | 8/1987 | European Pat. Off. ............... | 21/82 |
| 2138207A | 10/1984 | United Kingdom .................... | 27/10 |

OTHER PUBLICATIONS

Noriyoshi Yamauchi, "A Metal-Insulator-Semiconductor (MIS) Device Using a Ferroelectric Polymer Thin Film in the Gate Insulator", Japanese Journal of Applied Physics, vol. 25, No. 4, Apr., 1986, pp. 590–594.

Dennis Flandre and Fernand Van De Wiele, "A New Analytical Model for the Two-Terminal MOS Capacitor on SOI Substrate", IEEE Eleectronic Device Letters, vol. 9, No. 6, Jun. 1988.

DE Publication K Leucht, "Capacitor Technology for Electronic Engineers", Munich, 1981, Francis-Verlag, pp. 23–25.

"Matching Properties, and Voltage and Temperature Dependence of MOS Capacitors", James E. McCreary, IEEE Journal of Solid-State Circuits, vol. SC-16, No. 6, Dec. 1981.

"Fabrication of NMOS Capacitors with a Low-Voltage Coefficient at a Silicon Foundry", W. J. Helms, IEEE Electron Dev. Letters, vol. EDL-6, No. 1, Jan. 1985.

"Circuits and Technology Considerations for MOS Delta-Sigma A/D Converters", Max W. Hauser and Robert W. Broadersen, IEEE International Symposium on Circuits and Systems, 1986.

Primary Examiner—Jeffrey A. Gaffin
Assistant Examiner—Brian K. Young
Attorney, Agent, or Firm—Gregory M. Howison

[57] ABSTRACT

A semiconductor capacitor for use in an analog-to-digital converter includes two parallel connected capacitors with separate lower plates (44) and (46) fabricated of polycrystalline silicon and upper plates (52) and (54) also fabricated of polysilicon. The plates are separated by capacitive oxide dielectric structures (48) and (50). They are interconnected such that the lower plate (44) of one capacitor is connected to the upper plate (54) of the other capacitor and the lower plate (46) of the other capacitor is connected to the upper plate (52) of the first capacitor. With such a configuration, the odd ordered non-linearities contributing to the voltage coefficient errors are cancelled.

11 Claims, 3 Drawing Sheets

COMPENSATED CAPACITORS FOR SWITCHED CAPACITOR INPUT OF AN ANALOG-TO-DIGITAL CONVERTER

This application is a divisional of U.S. Pat. application Ser. No. 257,477, filed Oct. 13, 1988, now U.S. Pat. No. 4,918,454.

TECHNICAL FIELD OF THE INVENTION

The invention pertains in general to analog-to-digital converters and, more particularly, to the switched capacitor on the input of the analog-to-digital converter.

BACKGROUND OF THE INVENTION

As the precision of analog-to-digital converters increases, the processing problems and circuit design problems also increase due to the very low voltage increments that must be sensed. Additionally, the linearity of conventional analog-to-digital converters is being more tightly specified by consumers. In order to meet these specifications, it is necessary to fine tune both the processing and the circuit design in order to achieve the desired linearity.

One component that contributes to non-linearity problems is the capacitor in a switched capacitor analog modulator on the analog-to-digital converter. Typically, this capacitor is utilized to sample an input voltage by charging up the capacitor to the input voltage and then redistributing this charge to the input of an integration or comparator circuit. As the voltage on the input changes, the value of the capacitance also changes, resulting in an inherent non-linearity in the analog-to-digital converter. For high precision analog-to-digital converters, this can be a problem.

In a capacitor, the charge at the plate-to-dielectric interface is modulated by the applied voltage. Due to the finite volume and charge density in some type of plates, a depletion region can be formed in either or both of plate-to-dielectric interfaces, the width of which varies with voltage. Depending upon the type of material that the plate is fabricated from, this depletion region can significantly impact the voltage characteristics of the capacitor. For example, in double poly capacitors in which two polycrystalline silicon plates are provided with a silicon dioxide dielectric, the variation in capacitance can be substantial if the doping differs significantly between the plates.

With respect to Metal Oxide Silicon (MOS) or Silicon Oxide Silicon (SOS) capacitors, which are the type normally incorporated into integrated circuits, the nominal capacitance value and the rate of change of capacitance over some voltage interval is utilized to specify the capacitor. This is defined as the voltage coefficient of capacitance which is the rate of fractional change in capacitance for unit voltage at some DC voltage. In a MOS or SOS capacitor, the value of capacitance is given by a series combination of the oxide and space charge capacitances. For example, in a metal-oxide-silicon interface capacitor, there is only one space charge capacitance which is due to the depletion region formed in the silicon. However, in a poly-oxide-poly capacitor (SOS), there is a depletion region on both sides of the oxide, these depletion regions change as a function of voltage. The relationship of the capacitance value to the applied voltage coefficient for MOS capacitors is described in J.L. McCreary, "Matching Properties and Voltage and Temperature Dependence of MOS Capacitors", IEEE J. of Solid State Circuits, Vol. SC16, No. 6 (Dec. 1981), pages 608–615.

In McCreary, it is noted that there is a partial cancellation of voltage coefficients for poly-oxide-poly or poly-oxide-silicon capacitors where the doping concentrations are approximately equal. However, the voltage coefficient is still significant in MOS capacitors utilizing one silicon interface or SOS capacitors utilizing two silicon interfaces with uneven doping due to processing variations. This is even true in the poly-oxide-poly capacitors wherein processing variations may result in different doping levels in the two plates at the silicon-to-oxide interface and there also may be doping gradients which result in differing dopant levels at the interface. These doping levels significantly affect the size of the depletion region and, subsequently, the voltage coefficient. This can be a problem during fabrication of the capacitors for the switched input of a delta-sigma type analog modulator in that cancellation of the first order voltage coefficient of the capacitor is realized only when the doping profiles are essentially identical in the two plates on poly-oxide-poly or poly-oxide-silicon capacitors. However, for practical processing these doping profiles tend to be different.

SUMMARY OF THE INVENTION

The present invention disclosed and claimed herein comprises an MOS or SOS capacitor having a low voltage coefficient. The capacitor includes a first lower electrode and a second lower electrode with a first upper electrode disposed over the first lower electrode and a second upper electrode disposed over the second lower electrode. A first layer of capacitor dielectric is disposed between the first lower electrode and the first upper electrode and a second layer of capacitor dielectric is disposed between the second upper electrode and the second lower electrode. At least the first and second lower electrodes or the first and second upper electrodes are fabricated from a semiconductor based material, which semiconductor based material can be polycrystalline silicon. The first and second lower electrodes are substantially identical and the first and second upper electrodes are substantially identical. A first interconnect is provided for connecting the first lower electrode to the second upper electrode and a second interconnect is provided for connecting the first upper electrode to the second lower electrode. This provides a parallel combination of capacitors of opposite polarity. This is termed an antiparallel connection.

In another aspect of the present invention, the two capacitors can be connected in a series configuration wherein a first interconnect is provided for interconnecting the first and second upper level electrodes together and then a connection is provided to the first lower electrode and the second lower electrode to provide the first and second terminals of the capacitor.

In yet another aspect of the present invention, the upper and lower electrodes are both fabricated from polycrystalline silicon with the first and second lower electrodes fabricated from a common layer of polycrystalline silicon and the first and second upper electrodes fabricated from a common layer of polycrystalline silicon. A silicon substrate is provided upon which a layer of isolation oxide is formed. The first and second lower electrodes are fabricated on the upper surface of the layer of isolation oxide.

In a further aspect of the present invention, the MOS or SOS capacitor is utilized in the delta-sigma modulator of an analog-to-digital converter wherein the delta-sigma modulator has a switching capacitor input. The terminals of the capacitor are disposed between first and second switching circuitry. The first switching circuitry is operable to connect the first terminal of the MOS or SOS capacitor to an input voltage and the second terminal thereof to a reference voltage during a charging cycle. The second switched circuitry is operable to connect the second terminal on the capacitor to the input of the delta-sigma modulator and the first terminal of the MOS capacitor is connected to a reference voltage during a redistribution cycle. Clock circuitry is provided for controlling the delta-sigma modulator and generating control signals for the first and second switched circuitry to operate in either the charging cycle or the redistribution cycle.

BRIEF DESCRIPTION OF THE DRAWINGS

For a more complete understanding of the present invention and the advantages thereof, reference is now made to the following description taken in conjunction with the accompanying Drawings in which.

Figure 1:
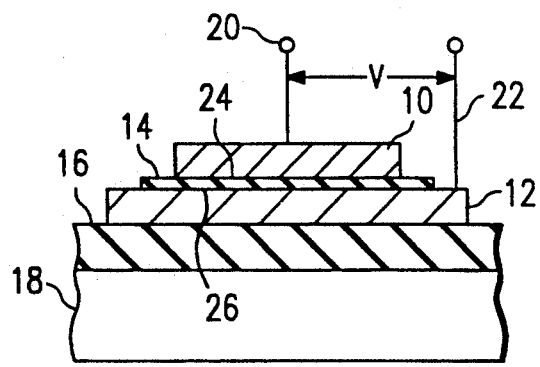
FIG. 1, illustrates a cross-sectional diagram of a poly-oxide-poly capacitor.

It will be appreciated that for purposes of clarity and where deemed appropriate, reference numerals have been repeated in the figures to indicate corresponding features and that the cross-sectional diagrams have not necessarily been drawn to scale in order to more clearly show important features of the present invention.

DETAILED DESCRIPTION OF THE INVENTION

Referring now to FIG. 1, there is illustrated a cross-sectional diagram of a SOS capacitor. The capacitor is comprised of an upper plate 10 of polycrystalline silicon and a lower plate 12 of polycrystalline silicon (hereinafter referred to as poly). The poly plates 10 and 12 are separated by a layer of silicon dioxide 14. The lower plate 12 is disposed on top of a layer of field oxide 16, which is formed on top of a silicon substrate 18.

During fabrication of the SOS capacitor of FIG. 1, the field oxide layer 16 is first grown on the substrate by conventional techniques. Thereafter, a conformal layer of poly is deposited onto the substrate and then etched to form the lower plate 12. This poly layer is either deposited with additional doping to increase the conductance thereof or, after deposition thereof is implanted with impurities of either N-type or P-type to increase conductivity. After formation of the lower plate 12, a thin layer of silicon dioxide is deposited or grown on the substrate which in part forms the capacitive oxide layer 14. Thereafter, a second conformal layer of poly is deposited onto the substrate and then etched to form the upper plate 10. During formation of the second poly layer on the substrate, it is either deposited with dopant impurities already contained therein or the impurities are later implanted therein to increase the conductivity thereof.

A depletion region is formed at the silicon-to-oxide interface 24 on the lower surface of the upper plate 10 and the depletion region 26 is formed at the silicon-to-oxide interface on the upper face of the lower plate 12. When the voltage is applied across the upper plate 10 and the lower plate 12 on terminals 20 and 22, respectively, the widths of these depletion regions are modulated by the voltage dependant plate charges. For matched upper and lower plate doping, the increase in depletion region width at one plate is compensated by a roughly equal decrease in depletion region width at the other plate. Although the dopant levels are initially designed to be equal in the upper plate 10 and the lower plate 12, there are some variations as a result of processing steps. For example, the step of forming the oxide layer 14 and upper plate 10 can cause the dopant profile adjacent to the upper surface of the lower plate 12 to change relative to the dopant profile on the lower surface of the upper plate 10. This can result in different depletion regions at the interfaces 24 and 26. As will be described hereinbelow, this can result in voltage coefficient non-linearities.

Regardless of the cause of the voltage coefficient for a given capacitance it can always be expressed in a Taylor series expansion as:

$$C = C_0 + \alpha V + \beta V^2 + \ldots \quad (1)$$

It can be seen that there are various first order, second order, third order, etc. coefficients, with the first order coefficient $\alpha$ normally being the dominant coefficient. In order to have a linear capacitor, it is necessary to reduce these coefficients to zero or to cancel the coefficients.

Figure 2:
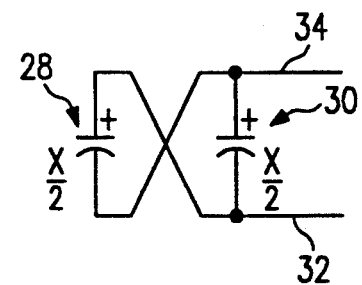
FIG. 2, illustrates a schematic representation of the antiparallel combination of the capacitor.

In accordance with one aspect of the present invention, the odd order coefficients, and especially the first order coefficient, are cancelled. It can be seen from equation one that if two capacitors are combined in parallel, one with a negative voltage thereacross and one with a positive voltage thereacross, the odd order coefficients corresponding to the odd order non-linearities will be cancelled. This configuration is illustrated in FIG. 2. In FIG. 2, a first capacitor 28 is provided having an upper plate and a lower plate and a second capacitor 30 is provided having an upper plate and a lower plate. The upper plate of the capacitor 28 is connected to the lower plate of the capacitor 30 on a node 32 and the lower plate of capacitor 28 is connected to the upper plate of capacitor 30 on a node 34. Both capacitors 28 and 30 have a value X/2. This results in a total capacitance value of X. When so configured, the sum of the two capacitances and their voltage non-linearities is as follows:

$$C = \frac{(C_0 + \alpha V + \beta V^2 + \ldots)}{2} + \quad (2)$$

-continued
$$\frac{(C_0 + \alpha(-V) + \beta(-V)^2 + ..)}{2}$$

It can be seen that the odd order non-linearities cancel and, therefore, the dominant non-linearity, the first order non-linearity, is cancelled, leaving only the even non-linearities.

Figure 3:
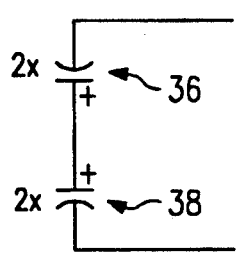
FIG. 3, illustrates a series configuration of the capacitor.

Referring now to FIG. 3, there is illustrated another configuration utilizing a first capacitor 36 and a second capacitor 38 connected in series. They are connected in series such that the top plate of capacitor 36 is connected to the top plate of capacitor 38 with both capacitors having a value of 2X. This results in a total value of capacitance of X. The relationship is as follows:

$$C = $$

$$\frac{(C_0 + \alpha V + \beta V^2 + \delta V^3 + \sigma V^4 + \ldots) \ast}{(C_0 + \alpha V + \beta V^2 + \delta V^3 + \sigma V^4 + \ldots) + 3} = $$
$$(C_0 + \alpha(-V) + \beta(-V)^2 + \delta(-V)^3 + \sigma(-V)^4 + \ldots)$$
$$(C_0 + \alpha(-V) + \beta(-V)^2 + \delta(-V)^3 + \sigma(-V)^4 + \ldots)$$

$$\frac{C_0^2 + (2\beta C_0 - \alpha^2) V^2 + (\beta^2 + 2\sigma C_0 - 2\alpha\delta) V^4 + \ldots}{2(C_0 + \beta V^2 + \sigma V^4 + \ldots)}$$

so that again, only the even terms in the composite expression are effective. Alternately, the total reciprocal capacitance can be solved from the sum of the Taylor expanded reciprocal capacitance expressions for the two series capacitors:

$$1/C = D = (D_0 + aV + bV^2 + cV^3 + dV^4 + \ldots) +$$
$$(D_0 + a(-V) + b(-V)^2 + c(-V)^3 + d(-V)^4 + \ldots)$$
$$= 2(D_0 + bV^2 + dV^4 + \ldots)$$

Here the odd order impedance (as opposed to admittance terms) are cancelled. It can be seen that these expressions imply significantly reduced non-linearity from the uncompensated values when all error terms are small but present.

Figure 4:
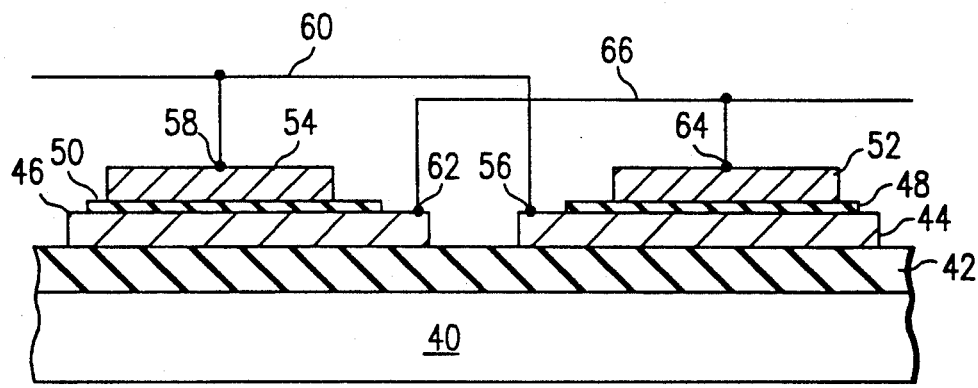
FIG. 4, illustrates a cross-sectional diagram of the antiparallel configuration of FIG. 2.

Referring now to FIG. 4, there is illustrated a preferred embodiment utilizing parallel capacitors. The capacitors are fabricated on a substrate 40, upon which a layer of field oxide 42 is grown. The first layer of poly is deposited on the substrate and patterned to form two lower electrodes 44 and 46. A single layer of silicon dioxide is grown or deposited on the substrate, resulting in two capacitive dielectric structures 48 and 50, over lower electrodes 44 and 46, respectively. However, the structures 48 and 50 could be comprised of silicon nitride or a sandwich structure of silicon dioxide and silicon nitride. It should be noted that although the capacitive dielectric structures 48 and 50 are illustrated as being separate, they are formed simultaneously and are therefore substantially identical. After formation of the capacitive oxide structures 48 and 50, a second layer of poly is deposited on the substrate and patterned to form upper electrodes 52 and 54 over capacitive oxide structures 48 and 50 respectively. As described above with reference to FIG. 1, the lower electrodes 44 and 46 have essentially the same doping profile as each other and the upper electrodes 52 and 54 in the second layer of poly have essentially the same doping profile as each other. However, there is sufficient difference between the doping profiles in the first poly layer compared to the second poly layer to cause non-linearities. This is a conventional problem and only exacting detail to the processing would allow identical dopant profiles.

After fabrication of the SOS capacitors, a layer of interlevel oxide is formed over the substrate (not shown) followed by opening of contact windows and then a layer of metal or other contact material is deposited on the substrate to contact the underlying layers. A contact 56 is made to the lower electrode 44 and a contact 58 is made to the upper electrode 54 on the other capacitor. These two contacts 56 and 58 are interconnected by an upper level metal or other conductive line 60, that is illustrated as an electrical connection. However, it should be understood that this connection is formed in a separate layer.

A contact 62 is made to the lower electrode 46 and a contact 64 is made to the upper level electrode 52 on the other capacitor. These contacts 62 and 64 are interconnected with a conductive line 66, similar to conductive line 60. Conductive lines 60 and 66 are patterned in the same upper level metal. This provides the electrical structure illustrated in FIG. 2 with the odd order non-linearities thereof compensated for. This is due to the fact that the dopant profiles of lower electrode 44 and lower electrode 46 are essentially identical, as are the dopant profiles of upper electrodes 52 and 54. Therefore, the odd order voltage non-linearities will be essentially equal and will be cancelled because of this configuration. Further, only a minimal increase in area results since both capacitors are half-size capacitors.

Figure 5:
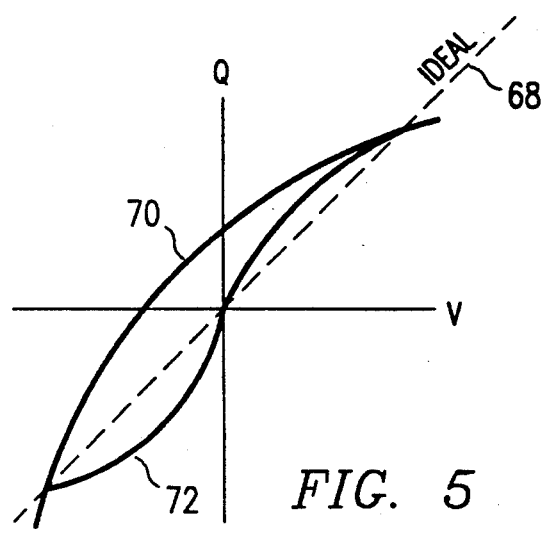
FIG. 5, illustrates a charge-voltage curve for the uncompensated and compensated capacitors.

Referring now to FIG. 5, there is illustrated a plot of charge versus voltage representing the QV characteristics of the MOS or SOS capacitor. Under ideal conditions, the capacitor would have zero non-linearity and charge would follow an ideal curve 68, represented by a dotted line. However, the individual MOS or SOS capacitors, due to their slight variations in doping profiles on the plates, result in a QV curve 70 which is offset from the ideal curve 68. When the capacitors are connected in antiparallel with the electrodes crossed as illustrated in FIGS. 2 and 4, the curve 72 results. The curve 72 has approximately a cubic shape since the second order of the capacitance $\beta V^2$ is multiplied by the voltage V resulting in a cubic expression. This is to be expected. The non-linearity of the curve 72 is significantly reduced from that of the curve 70.

Figure 6:
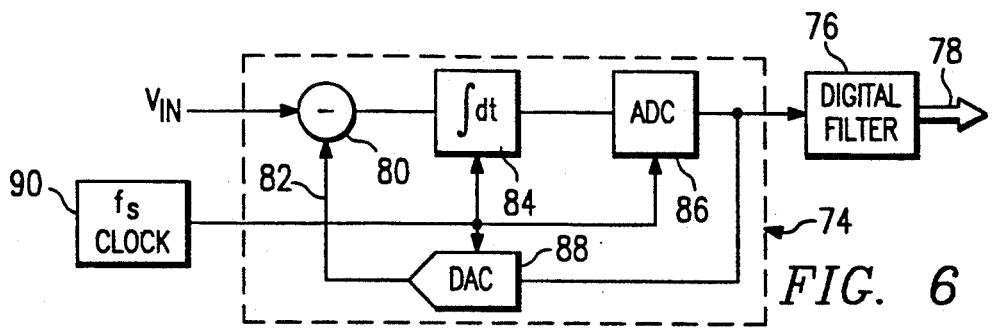
FIG. 6, illustrates a block diagram of an analog-to-digital converter utilizing the invention.

Referring now to FIG. 6, there is illustrated a block diagram of an analog-to-digital converter. The analog-to-digital converter is comprised of a delta-sigma type analog modulator 74 which is operable to receive an analog input voltage $V_{IN}$ and convert it into an output pulse string having an average amplitude over time proportional to the analog input voltage. The output of the analog modulator 74 is input to a digital filter 76 to filter undesired signal and noise to provide a filtered output on a digital bus 78.

The analog modulator 74 has a summing junction 80 for receiving the analog input voltage $V_{IN}$ and summing it with a feedback signal on a feedback line 82. The output of the summing junction 80 is input to an integrator 84. The integrator has the output which is the input to an analog-to-digital converter (ADC) 86, the output of which provides an output of digital pulses. The output of the ADC 86 is connected to the input of a digital-to-analog converter (DAC) 88, the output of which comprises the feedback line 82. The integrator 84, the ADC 86 and the DAC 88 have the clock inputs thereof connected to the output of a sample clock circuit 90 that operates at a sampling frequency $F_S$.

The analog modulator 74 is operable to oversample the analog input and produce a low-resolution digital output. Typically, the ADC 86 and the DAC 88 have one bit of resolution with the ADC 86 being realized with a comparator and the DAC 88 feeding back only one of two voltages plus or minus full-scale. With only two output levels, the DAC 88 is inherently linear. Overall modulator linearity is limited primarily by non-idealities in the integrator 84 and the linearity of the summing junction 80 which includes the sampling capacitor and appropriate switching circuits.

Figure 7:
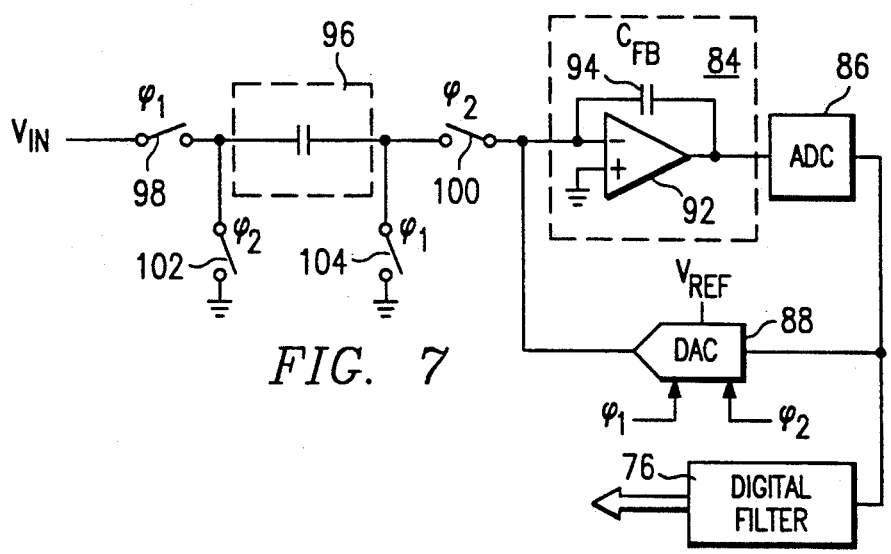
FIG. 7, illustrates a block diagram of the analog modulator utilizing the switched capacitor input.

Referring now to FIG. 7, there is illustrated a detailed block diagram of the analog modulator 74 of FIG. 6. The integrator is comprised of a differential amplifier 92 having a feedback capacitor 94 ($C_{FB}$) connected between the output thereof and the inverting input. The non-inverting input thereof is connected to a reference voltage labelled ground for simplicity. The integrator 84 also includes a sample and hold circuit comprised of a switched capacitor 96. The switched capacitor 96 is illustrated with a capacitor symbol inside a dotted line. This capacitor can be comprised of the configuration of FIG. 2 or the configuration of FIG. 3. The switched capacitor 96 has one side thereof connected to a switch 98 and the other side thereof connected to one side of a switch 100. The switch 98 is operable to connect the input side of the capacitor 96 to the $V_{IN}$ analog input signal and the switch 100 is operable to connect the amplifier side of the capacitor 96 to the inverting input of the differential amplifier 92. The input side of the capacitor 96 is connected to one side of a switch 102, switch 102 being operable to selectively connect the analog input side of the capacitor 96 to ground. The amplifier side of the capacitor 96 is connected to one side of a switch 104, the switch 104 being operable to connect the amplifier side of the capacitor 96 to ground.

Switches 98 and 104 are operable to close in response to generation of a sample clock signal $\phi_1$ and switches 102 and 100 are operable to close in response to generation of a sample clock signal $\phi_2$. In operation, when $\phi_1$ is generated, switch 104 closes connecting the amplifier side of the capacitor 96 to ground and switch 98 closes connecting the analog input voltage to the analog input side of a capacitor 96. This results in sampling of the analog voltage across the capacitor 96 in a sample operation. Thereafter, switches 98 and 104 are opened and, during $\phi_2$, switch 100 is closed and switch 102 is closed to impress the analog input voltage on the inverting input of the differential amplifier 92 in a redistribution operation. Therefore, the capacitor 96 is switched to provide a sample operation followed by a charge redistribution operation.

Figure 8:
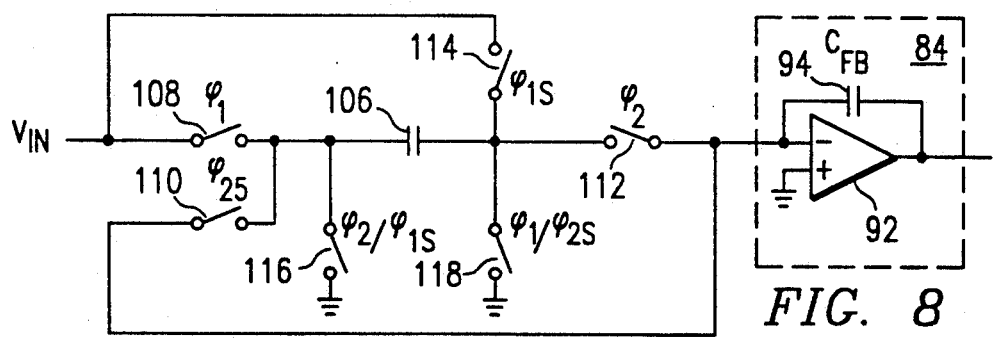
FIG. 8, illustrates an alternate embodiment of the switched capacitor input utilizing only a single capacitor.

Referring now to FIG. 8, there is illustrated an alternate embodiment of the switched capacitor 96 on the input of the differential amplifier 92. A single switched capacitor 106 is provided that is switchably connected to the input voltage $V_{IN}$ through a switch 108 or switchably connected to the inverting input of differential amplifier 92 through a switch 110. In a similar manner, the other side of the capacitor 106 is switchably connected to the inverting input of the amplifier 92 through a switch 112 or to the voltage $V_{IN}$ through a switch 114. The one side of capacitor 106 connected to switches 108 and 110 is switchably connected to ground through a switch 116 and the other side of the capacitor 106 is switchably connected to ground through a switch 118.

The switches operate in a forward mode or a reverse mode. In the forward mode, the switched capacitor 106 is operated with one side receiving the sampled input voltage and the other side redistributing the charge to the inverting input of the differential amplifier 92. In the reverse mode, the terminals of the capacitor 106 are reversed such that the other terminal of the capacitor receives the input voltage $V_{IN}$ and the charge is redistributed from the opposite terminal. In this manner, any error in the forward direction will be opposed by an equal and opposite error in the reverse direction with the integrator 84 providing a time averaged output which will essentially remove any odd order voltage non-linearities.

The sample clock circuit 90 outputs two clock signals $\phi_1$ and $\phi_2$ in the forward mode and two clock signals $\phi_{1S}$ and $\phi_{2S}$ in the reverse mode. In the forward mode, $\phi_1$ controls switches 108 and 118 and $\phi_2$ controls switches 112 and 116. Therefore, switches 108 and 118 are closed in the sample mode to charge the capacitor and switches 112 and 116 are closed in the charge redistribution mode to transfer the charge to the inverting input of the differential amplifier 92. In the reverse mode, $\phi_{1S}$ is applied to switches 114 and 116 for the sampling or charge operation and clock $\phi_{2S}$ controls switches 110 and 118 for the charge redistribution operation. Therefore, in the charging operation, switch 114 and switch 116 are closed and in the charge redistribution operation, switches 110 and 118 are closed.

Figure 9:
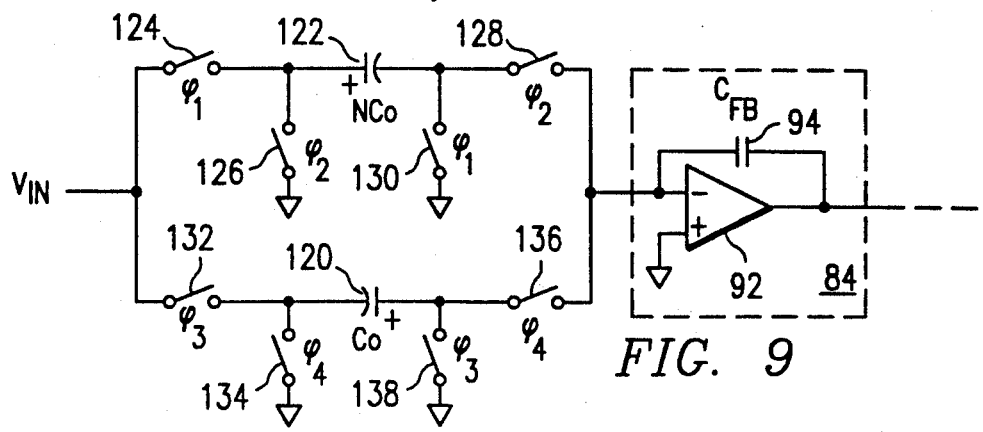
FIG. 9, illustrates an alternate embodiment of the switching circuit on the input of the analog modulator.

Referring now to FIG. 9, there is illustrated an alternate embodiment of the switching circuit on the input to the differential amplifier 92. The switching circuit is comprised of two switched capacitors, a capacitor 120 having a value of $MC_O$ and a capacitor 122 having a value of $NC_O$. Each of the capacitors 120 and 122 have a polarity indicated by a "+", indicating that they are of reverse polarities. The polarity indicates the lower and upper plates wherein the "+" indicates the upper plate of the capacitor. Capacitor 122 has the "+" side thereof switchably connected to the voltage $V_{IN}$ through a switch 124, switch 124 being controlled by a $\phi_1$ clock signal. The "+" side of capacitor 122 is also switchably connected to ground through a switch 126, switch 126 controlled by a $\phi_2$ clock signal. The negative plate of capacitor 122 is switchably connected to the input of the inverting input of the differential amplifier 92 through a switch 128 and switch 128 is controlled by clock signal $\phi_2$. The negative plate of capacitor 122 is also connected to ground through a switch 130, switch 130 being controlled by the clock signal $\phi_1$. During the charge operation, switches 124 and 130 are closed in response to generation of the $\phi_1$ clock signal. In the charge redistribution operation, switches 124 and 130 are open and switches 126 and 128 are closed in response to generation of the $\phi_2$ clock signal.

The negative plate of capacitor 120 is switchably connected to $V_{IN}$ through a switch 132, switch 132 controlled by a $\phi_3$ clock signal. The negative plate of capacitor 120 is also switchably connected to ground through a switch 134, switch 134 controlled by a $\phi_4$ clock signal. The positive plate of capacitor 120 is switchably connected to the inverting input of the differential amplifier 92 through a switch 136, switch 136 controlled by the $\phi_4$ clock signal. The positive plate of capacitor 120 is also switchably connected to ground through a switch 138, switch 138 controlled by the $\phi_3$ clock signal.

During the charge operation, switches 132 and 138 are closed in response to generation of the $\phi_3$ clock signal. In the redistribution operation, switches 132 and 138 are open and switches 134 and 136 are closed in response to generation of the $\phi_4$ clock signal.

The $\phi_1$ and $\phi_2$ clock signals are generated through one charge/redistribution cycle and then, in a subsequent charge/redistribution cycle, the $\phi_3$ and $\phi_4$ clock signals are generated, the $\phi_1$, $\phi_2$, $\phi_3$, and $\phi_4$ clock signals all generated by the $F_S$ clock circuit 90. However, the charge/redistribution cycle of the $\phi_1/\phi_2$ clock cycles is operated M times during every N cycles of the $\phi_3/\phi_4$ charge/redistribution cycle. This causes the nominal average charge over time sampled on the two capacitors to be equal, allowing the odd order coefficient cancellation described previously. This duty cycle allows the odd order voltage coefficients in the capacitor 120 to be cancelled out by the odd order voltage coefficients in the capacitor 122.

Referring now to FIGS. 10a–10d, there is illustrated an alternate embodiment utilizing the switched capacitor configuration with a digital-to-analog converter (DAC). This embodiment is primarily directed toward compensating a major portion of the voltage coefficient of capacitance in a switched capacitor wherein the output voltage is achieved by using weighted capacitors switched to either of two references (one of which may be ground) to determine total charge placed on a feedback capacitor tied around an output amplifier. This feedback capacitor can be either a separate capacitor from the input array, or it can be the array used to acquire the charge, but used at a different (charge redistribution) time.

Figure 10B:
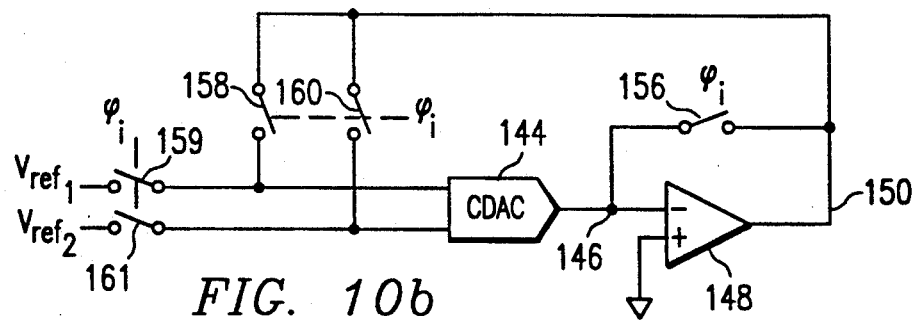
FIGS. 10a–10d illustrate an alternate embodiment utilizing a digital-to-analog converter.
Figure 10A:
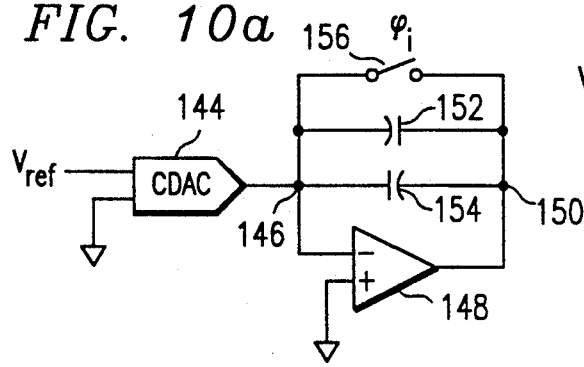

With reference to FIG. 10a, the capacitor digital-to-analog converter (CDAC) is represented by block 144 which has the input tied to a reference voltage and ground. The output of the CDAC 144 is a summing junction 146 which is connected to the inverting input of a differential amplifier 148. The positive input thereof is connected to ground. The output is connected to an output node 150. Two capacitors 152 and 154 are connected in feedback around the differential amplifier 148 between nodes 146 and 150 in an antiparallel configuration with reverse polarities. This represents the separate capacitor from that of the input array CDAC 144. A switch 156 is provided between nodes 146 and 150 and controlled by a clock signal $\phi_i$. In operation, the switch 156 is closed during the acquisition or sample time to short the summing junction 146 to the output node 150. The internal capacitors to the CDAC 144 are toggled to one reference voltage during the sample time. During a charge redistribution time, switch 156 is opened and the internal capacitors are also toggled in the CDAC 144.

With reference to FIG. 10b, there is illustrated the other option wherein the CDAC array is used to acquire the charge and also to provide the redistribution capacitor during redistribution mode. In this configuration, the capacitors 152 and 154 are deleted and the output node 150 is the input to one side of a pair of switches 158 and 160. Switch 158 has the other side thereof connected to one of the reference inputs of the CDAC 144 and the other side of the switch 160 is connected to the other of the inputs to the CDAC 144. The switches 158 and 160 are controlled by a clock signal $\phi_T$ that operates during the charge redistribution operation. Switches 159 and 161 are connected between the two reference inputs and the reference voltages and controlled by clock $\phi_i$ during the sample time.

Figure 10C:
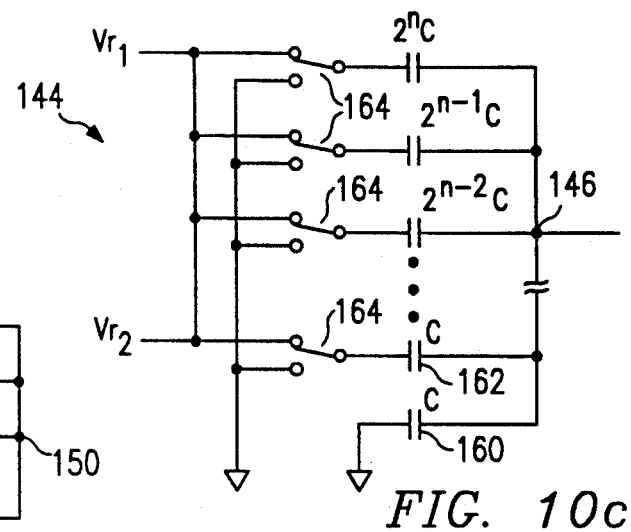

Referring now to FIG. 10c, there is illustrated a schematic of the capacitive array 144. The array is comprised of a plurality of various size capacitors having one plate thereof connected to the summing junction 146. The capacitors are weighted capacitors with one dummy capacitor 160 with a value of C with one of the weighted capacitors also having a value of C and represented by reference numeral 162. The remaining capacitors have a binary weighting value. The other plate of the capacitors is tied to one side of a switch 164 which is operable to connect the other side of the capacitor to either the reference voltage $V_{REF}$ or to ground. The plates of the capacitors in the CDAC array 144 are initially tied to either $V_{REF}$ on the one input reference voltage terminal or to ground on the other input reference terminal. The input digital value to the CDAC 144 determines the initial setting during the sample time. The plates are switched to the other reference voltage during the charge redistribution time.

The critical capacitor which must be compensated for voltage coefficient in the embodiment of FIG. 10a is the feedback capacitor. In this configuration, only two points on the charge vs. voltage curve are utilized for each capacitor in the CDAC array. Therefore, voltage coefficient non-linearities in these capacitors do not result in substantial transfer function non-linearities in the circuit. However, if a given incremental charge on the feedback cap provides a change in voltage which is dependent on the voltage itself, this results in an integral non-linearity. The odd terms of the Taylor expansion of this non-linearity can be compensated by forming the feedback cap of an anti-parallel combination of two half-size caps or the series combination of two reverse polarity double-size caps. In the configuration of FIG. 10b, the voltage coefficient in the CDAC capacitors causes a linearity error during the charge redistribution phase. The preferred embodiment of compensating the odd order terms of this error is to utilize anti-parallel caps for each individual capacitor in the array.

Figure 10D:
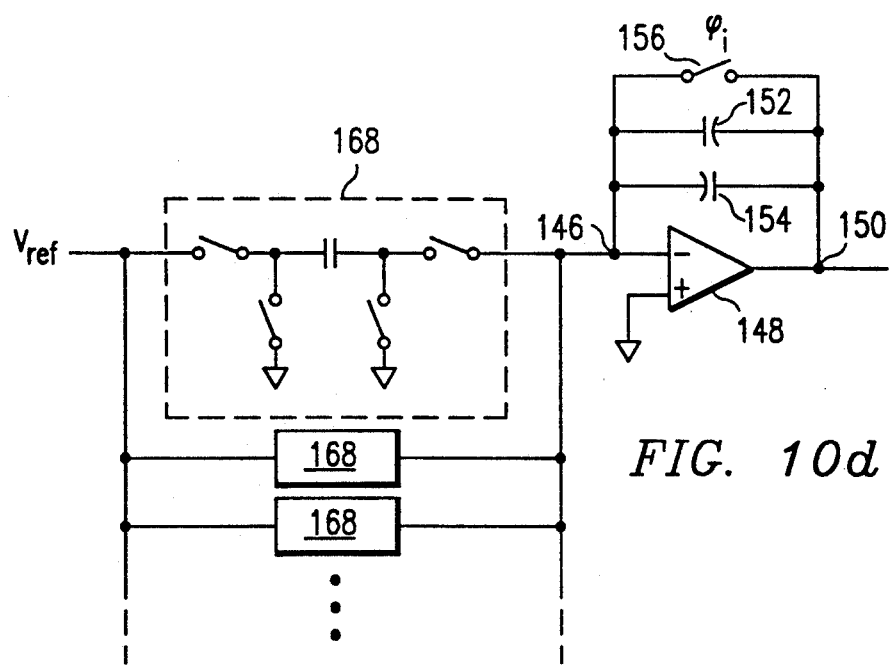

Another method for achieving a voltage-out DAC is illustrated in FIG. 10d. In this configuration, a plurality of switching capacitor circuits 168 are connected between the summing junction 146 and a reference voltage. The switching capacitor is switched between one of two reference voltages $V_{REF}$ and ground with one or more of the switching capacitor circuits switched between these two references. The charge from these switching operations is integrated by a switched capacitor integrator. The output voltage of the integrator is then dependent on the size and the frequency of use of the switching capacitors over the given period. The voltage coefficient of the switching capacitors does not matter if they are always switching between the same two references. However, the integrating cap has a changing output voltage depending on input coding which will show non-linearities due to voltage coefficient. This integrating capacitor is anti-parallelled or anti-seriesed in accordance with the present invention to minimize non-linearities. If the input CDAC is a multiplying DAC where the reference voltages are changing as an input signal to the DAC, then the voltage coefficient of the switching capacitors are important and they should also be compensated.

In summary, there has been provided an analog-to-digital converter with a switched capacitor delta-sigma modulator. The switched capacitor in the modulator is a compensated capacitor which provides compensation for the non-linearities. The capacitor is fabricated utilizing an MOS or SOS capacitor having at least one plate thereof fabricated from a semiconductor material. In the preferred embodiment, two capacitors are utilized, each capacitor being a half-size capacitor, with the two capacitors being connected in antiparallel. The capacitors are configured such that the top plate of one capacitor is connected to the lower plate of the parallel capacitor. This provides an effective cancellation of odd order non-linearities.

Although the preferred embodiment has been described in detail, it should be understood that various changes, substitutions and alterations can be made therein without departing from the spirit and scope of the invention as defined by the appended claims.

We claim:

1. A semiconductor capacitor having a low voltage coefficient, comprising:
   a first lower electrode;
   a second lower electrode;
   a first upper electrode disposed over said first lower electrode and separated therefrom;
   a second upper electrode disposed over said second lower electrode and separated therefrom;
   a first layer of capacitor dielectric disposed between said first lower electrode and said first upper electrode;
   a second layer of capacitor dielectric disposed between said second upper electrode and said second lower electrode;
   said first and second lower electrodes and said first and second upper electrodes being fabricated from polycrystalline silicone that is doped with impurities to increase the conductance thereof;
   said first and second lower electrodes being fabricated from a substantially identical material;
   said first and second upper electrodes being fabricated from a substantially identical material;
   first terminal means for connecting said first lower electrode to said second upper electrode; and
   second terminal means for interconnecting said second lower electrode to said first upper electrode.

2. The capacitor of claim 1 wherein said first and second capacitor dielectric layers comprise silicon dioxide.

3. The capacitor of claim 1 wherein said first and second capacitor dielectric layers have at least a portion thereof comprised of silicon nitride.

4. A semiconductor capacitor having a low voltage coefficient, comprising:
   a first lower electrode;
   a second lower electrode;
   a first upper electrode disposed over said first lower electrode and separated therefrom;
   a second upper electrode disposed over said second lower electrode and separated therefrom;
   a first layer of capacitor dielectric disposed between said first lower electrode and said first upper electrode;
   a second layer of capacitor dielectric disposed between said second upper electrode and said second lower electrode;
   said first and second lower electrodes and said first and second upper electrodes being fabricated from a semiconductor material;
   said first and second lower electrodes being fabricated from a substantially identical material;
   said first and second upper electrodes being fabricated from a substantially identical material;
   first terminal means for connecting said first lower electrode to said second upper electrode; and
   second terminal means for interconnecting said second lower electrode to said first upper electrode;
   a silicon substrate; and
   a layer of isolation oxide disposed on the surface of the silicon substrate;
   said first and second lower electrodes fabricated from polycrystalline silicon and disposed on the upper surface of said isolation oxide, said first and second lower electrodes fabricated from a common layer of polycrystalline silicon having a high level of impurities introduced therein to increase the conductance thereof such that said first and second lower electrodes have substantially identical parameters.

5. A semiconductor capacitor having a low voltage coefficient, comprising:
   a first lower electrode;
   a second lower electrode;
   a first upper electrode disposed over said first lower electrode and separated therefrom;
   a second upper electrode disposed over said second lower electrode and separated therefrom;
   a first layer of capacitor dielectric disposed between said first lower electrode and said first upper electrode;
   a second layer of capacitor dielectric disposed between said second upper electrode and said second lower electrode;
   said first and second lower electrodes and said first and second upper electrodes being fabricated from polycrystalline silicon that is doped with impurities to increase the conductance thereof;
   said first and second lower electrodes being fabricated from a substantially identical material;
   said first and second upper electrodes being fabricated from a substantially identical material;
   first conductive interconnect means for interconnecting said first and second upper level electrodes together;
   first terminal means for contacting said first lower electrode; and
   second terminal means for contacting said second lower electrode.

6. The capacitor of claim 5 wherein said first and second capacitor dielectric layers comprise silicon dioxide.

7. The capacitor of claim 5 wherein said first and second capacitor dielectric layers have at least a portion thereof comprised of silicon nitride.

8. A semiconductor capacitor having a low voltage coefficient, comprising:
   a first lower electrode;
   a second lower electrode;
   a first upper electrode disposed over said first lower electrode and separated therefrom;
   a second upper electrode disposed over said second lower electrode and separated therefrom;
   a first layer of capacitor dielectric disposed between said first lower electrode and said first upper electrode;
   a second layer of capacitor dielectric disposed between said second upper electrode and said second lower electrode;

said first and second lower electrodes and said first and second upper electrodes being fabricated from a semiconductor material;

said first and second lower electrodes being fabricated from a substantially identical material;

said first and second upper electrodes being fabricated from a substantially identical material;

first conductive interconnect means for interconnecting said first and second upper level electrodes together;

first terminal means for contacting said first lower electrode; and second terminal means for contacting said second lower electrode a silicon substrate; and a layer of isolation oxide disposed on the surface of the silicon substrate;

said first and second lower electrodes fabricated from polycrystalline silicon and disposed on the upper surface of said isolation oxide, said first and second lower electrodes fabricated from a common layer of polycrystalline silicon having a high level of impurities introduced therein to increase the conductance thereof such that said first and second electrodes have substantially identical fabrication parameters;

said first and second upper electrodes fabricated from polycrystalline silicon and disposed on the upper surface of said first and second layers of capacitor dielectric, respectively, said first and second upper electrodes fabricated from a common layer of polycrystalline silicon having a high level of impurities introduced therein to increase the conductance thereof such that said first and second upper electrodes have substantially identical parameters.

9. A method for manufacturing a semiconductor capacitor having a low voltage coefficient, comprising the steps of:

providing a substrate;

forming a layer of insulating material on the upper surface of the substrate;

forming a first conformal layer of polycrystalline silicon conductive material on the upper surface of the insulating layer;

patterning and etching the first conformal layer to form isolated first and second lower electrodes on the upper surface of the insulating layer;

forming a conformal layer of dielectric material over the first and second lower electrodes;

patterning the dielectric layer to expose at least a portion of the upper surface of the first and second electrodes;

forming the second conformal layer of polycrystalline silicon conductive material to provide first and second upper electrodes that are electrically isolated from one another and disposed over the first and second lower electrodes and separated therefrom by the dielectric layer and not covering the exposed portion of the upper surface of the first and second electrodes;

electrically connecting the first lower electrode and the second upper electrode together; and electrically connecting the second lower electrode and the first upper electrode together.

10. The method of claim 9 wherein the second conformal layer is comprised of polycrystalline silicon and wherein the dielectric area is comprised of silicon dioxide.

11. The method of claim 9 wherein the substrate is a silicon substrate and the step of forming the insulating layer comprises forming a layer of silicon dioxide over the surface of the silicon substrate.

* * * * *